(12) United States Patent
Widen, Jr. et al.

(10) Patent No.: US 11,984,708 B2
(45) Date of Patent: May 14, 2024

(54) POWER SUPPLY CIRCUIT WITH SYNCHRONIZATION FUNCTIONALITY

(71) Applicant: ROCKWELL AUTOMATION TECHNOLOGIES, INC., Mayfield Heights, OH (US)

(72) Inventors: James E. Widen, Jr., Lisbon, WI (US); Brian P. Brown, Mayville, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 17/956,554

(22) Filed: Sep. 29, 2022

(65) Prior Publication Data

US 2023/0327459 A1 Oct. 12, 2023

Related U.S. Application Data

(60) Provisional application No. 63/362,761, filed on Apr. 11, 2022.

(51) Int. Cl.
| | |
|---|---|
| *H02B 1/20* | (2006.01) |
| *G01R 31/52* | (2020.01) |
| *H02J 3/38* | (2006.01) |
| *H02J 3/40* | (2006.01) |
| *H02J 13/00* | (2006.01) |
| *H04L 7/00* | (2006.01) |

(52) U.S. Cl.
CPC ............. *H02B 1/202* (2013.01); *G01R 31/52* (2020.01); *H02J 3/381* (2013.01); *H02J 3/40* (2013.01); *H02J 13/00016* (2020.01); *H04L 7/0075* (2013.01)

(58) Field of Classification Search
CPC ........ H02J 3/40; H02J 3/381; H02J 13/00016; H04L 7/0075
USPC .......................................................... 307/43
See application file for complete search history.

(56) References Cited

U.S. PATENT DOCUMENTS 9,946,675 B2 * 4/2018 Biskup ................ G06F 13/4022

OTHER PUBLICATIONS

Allen-Bradley By Rockwell Automation, PowerFlex 755TM Non-Regenerative Supply, Mar. 2022, 28 pages.

* cited by examiner

*Primary Examiner* — Richard Tan
(74) *Attorney, Agent, or Firm* — Quarles & Brady LLP

(57) ABSTRACT

A power supply circuit for use with a power supply system. The power supply circuit can be provided within a power supply module connected with one or more additional power supply modules as part of the power supply system. The power supply circuit includes an optocoupler and a resistor ladder connected to the optocoupler. The circuit asserts a synchronization signal responsive to the optocoupler being energized.

15 Claims, 17 Drawing Sheets

POWER SUPPLY CIRCUIT WITH SYNCHRONIZATION FUNCTIONALITY

CROSS-REFERENCES TO RELATED APPLICATIONS

This application claims priority to and the benefit of the filing date of U.S. Provisional Patent Application No. 63/362,761, filed Apr. 11, 2022, the entire contents of which is incorporated by reference herein.

BACKGROUND

The present disclosure generally relates to a power supply system and associated circuitry and functionality. The power supply system can be used for industrial applications, such as provided in one or more electrical cabinets in a manufacturing facility. The power supply system can provide power to machinery and/or associated control components, such as electric motor drives and other electronic control components. The power supply system generally includes multiple interconnected power supply modules, that can be provided in different configurations for different applications.

There are several considerations when integrating parallel power structures. For example, a conventional power module can have only discrete (on/off) inputs and outputs, such that there can be no typical serial communication link outside of the module. Consequently, the only user configuration of the module can be through DIP-switch settings. Furthermore, each power module can have near-autonomous operation, while allowing for parallel configuration, with no central system controller to coordinate operation.

Other integration considerations include safety standards (e.g., UL standards) that can require that certain faults shut down all parallel power modules in a system. Still another consideration includes pre-charging that is open loop without current sensors, ensuring that all power modules have the same configuration switch settings, and synchronizing the start time of the pre-charge. Each power supply module can have a local internal power supply. Direct connection of interface signals between them has a high risk of common mode noise issues. Prior attempts, such as using a separate system power supply for the only interface signal, can create inefficiencies and be disadvantageous due to cost and configuration complexities.

The use of one of the parallel power modules as a single designated source of power can also be disadvantageous due to N-1 operation being a product requirement, such that if the "master" module fails and requires removal, reconfiguration of the system to a new master is required. Another challenge can be that avoiding security certification requirements for product release can require no non-volatile memory of system configuration or history. Consequently, the system can have to figure out its configuration on every power cycle.

SUMMARY

One aspect of the disclosure provides a power supply circuit including a first optocoupler for asserting a synchronization signal, a second optocoupler for reading a status of the synchronization signal, a resistor ladder connected to the first optocoupler and to a power supply voltage, a transistor connected to the resistor ladder and to the second optocoupler, a first wire connected to the first optocoupler, and a second wire connected to the first optocoupler. The circuit asserts the synchronization signal as a current signal via the first wire and the second wire responsive to the first optocoupler being energized.

Another aspect of the disclosure provides a power supply system including a first power supply module, a second power supply module, and a synchronization bus that connects the first power supply module and the second power supply module. The first power supply module includes a first optocoupler, a first resistor ladder connected to the first optocoupler and to a first power supply voltage, and a first pair of wires connected to the first optocoupler. The second power supply module includes a second optocoupler, a second resistor ladder connected to the second optocoupler and to a second power supply voltage, and a second pair of wires connected to the second optocoupler. The first power supply module asserts a first synchronization signal on the synchronization bus responsive to the first optocoupler being energized, and the first power supply module asserts the first synchronization signal on the synchronization bus as a current signal provided to the synchronization bus via the first pair of wires. The second power supply module asserts a second synchronization signal on the synchronization bus responsive to the second optocoupler being energized, and the second power supply module asserts the second synchronization signal on the synchronization bus as a current signal provided to the synchronization bus via the second pair of wires. The system establishes a synchronization between the first power supply module and the second power supply module responsive to the first synchronization signal and the second synchronization signal being asserted and de-asserted on the synchronization bus.

Yet another aspect of the disclosure provides a power supply circuit including an optocoupler, a resistor ladder connected to the optocoupler and to a power supply voltage, a first wire connected to a first terminal of the optocoupler, and a second wire connected to a second terminal of the optocoupler. The circuit asserts a synchronization signal as a current signal via the first wire and the second wire responsive to the optocoupler being energized.

BRIEF DESCRIPTION OF THE DRAWINGS

These and other features, aspects, and advantages of the present disclosure can become better understood when the following detailed description is read with reference to the accompanying drawings in which like characters represent like parts throughout the drawings, wherein.

DETAILED DESCRIPTION

Figure 1:
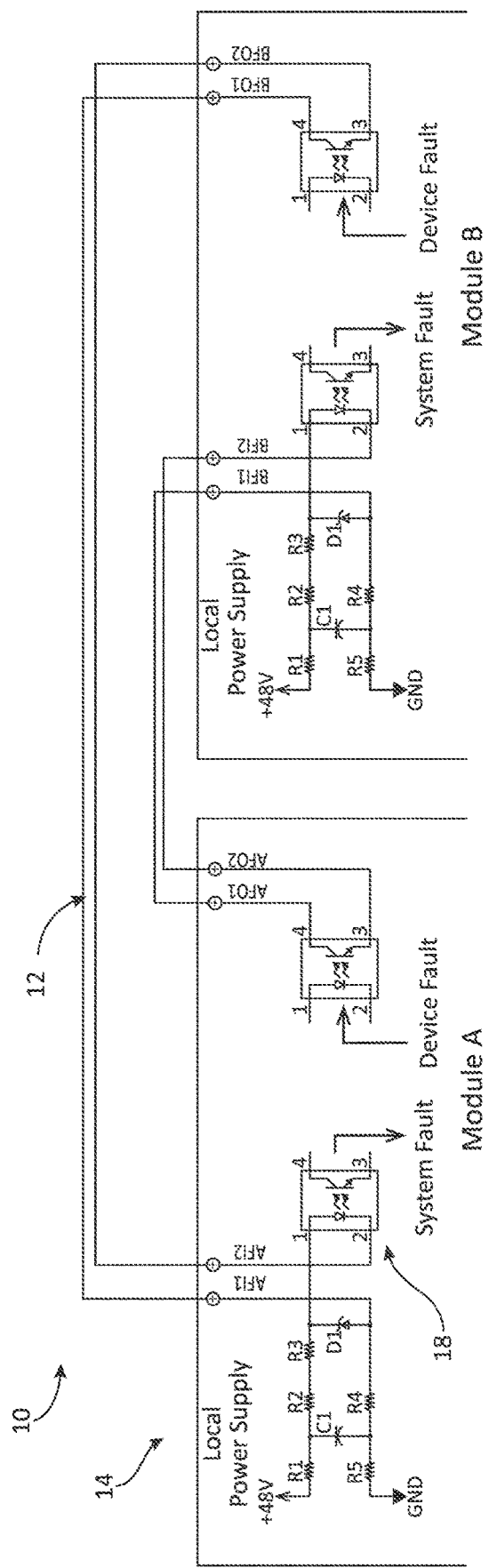
FIG. 1 is an example schematic illustration of a power supply system connecting two separate power supply modules via a fault bus, according to some aspects of the disclosure.

The present disclosure provides a power supply system and associated circuitry and methods of operation. The power supply system can include multiple power supply modules that are interconnected using a wire harness. The wire harness can include various components and can interconnect the power supply modules in a daisy chain configuration. The wire harness can include both a synchronization bus and a fault bus. The synchronization bus can provide a wire-or connection between the power supply modules in the power supply system, such that a concurrent precharge process can be implemented responsive to each of the power supply modules asserting a synchronization signal on the synchronization bus. The fault bus can be used to detect both system and device level faults, and can be connected to different terminals of the power supply modules in different configurations. The power supply modules generally use circuitry including optocouplers (opto-isolators), resistor bridges, and transistors to assert synchronization signals, read synchronization signals, and provide indications of faults within the power supply system. One or more aspects of the disclosure are provided in the PowerFlex 755™ Non-Regenerative Supply (NRS) product offering provided by Rockwell Automation (Allen-Bradley), among other possible product offerings.

One or more specific aspects of the disclosure will be described below. In the interest of providing a concise description of these aspects, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which can vary from one implementation to another. Moreover, it should be appreciated that such a development effort might be complex and time consuming, but would nevertheless be a routine undertaking of design, fabrication, and manufacture for those of ordinary skill having the benefit of this disclosure.

In some aspects of the disclosure, a system and method of interfacing parallel power structures as described herein can include the same type of discrete wire interface harnesses that are already being utilized in a system cabinet for control power distribution. The system and method can be implemented without a separate system controller and without requiring the individual power structures to remember the system configuration in non-volatile memory. The system and method can utilize wiring harness interconnection logic to meet agency safety requirements for system fault shut-down with fail-safe for open connections. The system and method can allow N-1, N-2, etc. operation that validates removal of the faulty unit by wiring harness interconnection logic. The system and method can enable parallel structures to recognize and validate the system configuration at power-up. The system and method can enable timing synchronization between parallel units. The system and method can provide testing integrity of synchronization interconnections at power-up.

The system and method can provide common-mode noise immunity from interaction between parallel power structures without requiring a separate system power supply by utilizing two distinct methods, including a daisy-chain wire harness interconnection scheme that provides full galvanic isolation of each link (used for configuration verification and fault handling), and an implementation of a wire-or interconnection using impedance isolation for interfacing signals with multiple power sources (used for pre-charge synchronization).

A modular cabinet harness system and method can be provided. A system and method for interfacing parallel power structures can include a daisy-chain wire harness interconnection scheme that provides full galvanic isolation of each link. The daisy-chain wire harness interconnection scheme can be configured for verification and fault handling. A system and method for interfacing parallel power structures can include an impedance isolated wire-or circuit. The impedance isolated wire-or circuit can be configured for pre-charge synchronization. The system and method can be configured to increase the number of conductors in existing discrete-wire interconnect cabling. The system and method can be configured to provide isolation from common-mode interaction between parallel power modules without requiring a separate interface power supply or requiring a module to be designated as a master.

The system and method can be configured to provide interface signal noise immunity from system power cabinet noise interference. The system and method can be configured to provide a single pre-installed cabinet wiring harness by utilizing various inter-cabinet coupling and loop-back links. The system and method can be configured to provide self-configuration and can be configured to support UL standard and other safety fault shut-down requirements. The system and method can be configured for interfacing cabinet overtemperature detection without requiring additional interface I/O. The system and method can be configured to synchronize open-loop pre-charge of parallel power modules. The system and method can be configured to control impedance-isolated wire-or current signaling logic through a pair of wires with a variable number of module taps. The system and method can be configured for power-up configuration verification. The system and method can include a low-speed asynchronous communication scheme through a daisy chain interface that can determine the number of modules and their position in the chain based on passing unique serial numbers through the chain. The scheme and method can be configured to support verification of the wire-or synchronization circuit.

Referring to FIG. 1, a power module system 10 is shown. The power module system 10 can include harness interconnection logic between a first power Module A and a second power Module B. The power module system 10 can be configured for fault handling and configuration verification. Power module system 10 as illustrated in FIG. 1 provides an example of an interconnection between two power supply modules in a power supply system for detecting and indicating faults throughout the system. A fault input terminal of Module A is connected to a fault output terminal of Module B via a wire harness 12. The fault input terminal of Module B can then be connected to a fault output terminal of a third power module C (not shown). The fault output terminal of Module A can also be connected to a fault input terminal of a fourth module D (not shown), and so on. The connections between fault input and output terminals of the individual power supply modules can be formed via connection to a fault bus of wire harness 12, where the fault bus is used by the individual power supply modules and the power supply system more generally to indicate faults that can occur.

Agency certification (e.g., meeting UL safety standards) can require that certain faults cause all parallel modules, e.g., modules A, B, of the power module system 10 to stop. Examples of faults can include bus capacitor bank imbalance, AC fuse open, DC fuse open, busbar overtemperature (e.g., applies to wiring bay), and failure of a monitoring system for various types of faults. Monitoring of faults can include monitoring for bad contacts or unplugged connections in wire harness 12, loss of control power in the power modules, and a non-operational field-programmable gate array (FPGA) or associated components of the main control board in an individual module. Mismatched configuration switch settings or voltage ratings of parallel units, harness interconnection failure, or phase-locked loop (PLL) loss during pre-charge can also cause a hard fault. Other faults can stay local to a given module, such that stopping other parallel modules may not be required.

FIG. 1 shows wire harness 12 forming a daisy chain structure for connecting Module A and Module B, however as noted any number of power modules can be used to provide varying levels of power supply. Each link in the daisy chain can be powered by the module receiving the signal. For example, Module A is shown to include its own individual power supply 14, which can be used along with the illustrated circuit components to provide full galvanic isolation at the receiving module. While the individual power supplies in FIG. 1 are shown to be 48V, it should be noted that different types and magnitudes of local power supplies can be used with the power supply systems and modules described herein, depending on the intended application. A differential wire pair controlling an optocoupler 18 (a first wire connected to a first terminal of optocoupler 18 as illustrated, and a second wire connected to a second terminal of optocoupler 18 as illustrated) with current (as opposed to voltage) is used for noise immunity in the power supply system cabinet where Module A and Module B are installed. The diodes (D1) shown in FIG. 1 can be used to limit the maximum voltage across thermal switches in the electrical cabinet.

The wire harness 12 can include building block components and harness links that self-orientate when the power module system 10 is assembled. When the last module in the system 10 is reached, the harness assembly 12 can loop the interconnect back to the first module in a daisy chain fashion. The wire harness 12 can fault due to an open connection in the chain. This behavior can allow a secondary function to detect system overtemperature sensing by routing the chain through one or more normally closed thermal switches (overtemperature switches) that open at high temperatures. This functionality can allow the power supply system to respond to possible hazards that can occur within one or more electrical cabinets in which the power supply system is installed, such as fires, excessive voltage, or excessive current within the power supply system and/or other electrical components in the one or more electrical cabinets.

At power-up, the wire harness 12 can also be used for low-speed serial communication to verify that the configuration switches (e.g., DIP switches) of all parallel Modules A, B have matching settings. The unique manufacturing serial number of each power supply module can be transmitted through the wire harness 12 at power-up. This functionality can allow each power supply module to identify the other modules in the power supply system, which can enable testing of a synchronization between the power supply modules connected to the wire harness 12. The power supply system can allow N-1, N-2, etc., operation down to a single remaining module. To allow this functionality, bypass jumpers can be pre-installed in the one or more system cabinets that complete the path of the wire harness when any individual power supply module is removed from the daisy chain. These bypass jumpers can be positioned so that the wire harness can be unable to connect to them when the corresponding power supply module is in place. If a non-parallel system is implemented, the output of a single power supply module can loop back to its own input through the system harness.

As shown in FIG. 1, the hard fault output of Module B (BFO1, BFO2) is cascaded to the cabinet fault input of Module A (AFI1, AFI2) via the wire harness 12 (e.g., via the fault bus of wire harness 12). The signal provided via these input and output terminals can be provided via a current loop circuit using a pair of wires between optocouplers, as shown in FIG. 1. Power for these current loops within the power supply system can be provided by the receiving power supply module (e.g., by the local power supply 14). The current loop pair can be over the same type of discrete wire harness that is used for 240V system power.

Full galvanic isolation between Module A and Module B can be provided via the circuitry illustrated in FIG. 1, where full galvanic isolation prevents common mode noise interaction between the power supply modules. The current loop can provide a high level of noise immunity for signal routing inside of the one or more system power cabinets. By defining that the de-energized optocoupler equals a fault condition, the interface can provide a fail safe for open connections. The fault signal can be routed through thermal switches (overtemperature switches) to detect cabinet overtemperature conditions. Low-speed asynchronous serial communication can be transmitted through these links at initial power-up. Afterwards, they can function as a static on/off fault signal. In an example of system operation, communication through the fault circuit can occur as shown in the state machine process flows below. It will be appreciated that these state machine process flows are provided as examples, and modifications to their operation are possible and contemplated.

Data Comms State Machine

1) Allow for any board-to-board powerup time variation
2) Assemble local data packet for subsequent transmission and comparison to subsequent received data packets
   a. Serial number
   b. Configuration bits
   c. Calculated CRC (Cyclic Redundancy Check), using a suitable polynomial for data packet
3) Enable UART RX
4) Wait for powerup module timer to expire
5) Enable UART TX state machine
6) Loop
   a. Transmit data
      i. For first iteration transmit board's data
      ii. After first iteration, forward most recently received RX data
   b. Wait for TX data complete
   c. Wait for RX data complete
   d. Perform CRC testing on RX data and set fault if appropriate
   d. Update serial number order as necessary
   e. Update roll-in count as necessary
      i. If >6, set roll-in count fault
   f. If RX serial number matches serial, data comms complete
7) Data comms complete

UART TX State Machine

1) Transmit bits per Data Comms State Machine
2) Transmit bits at an appropriate rate and of appropriate group sizing to ensure data integrity due to various influences such as signal edge rates, clock frequency differences, noise, etc.
   a. Start bit
   b. Data bit(s)
   c. Parity bit
   d. Stop bit
   e. Wait for completion
3) Repeat until entire data packet sent

UART RX State Machine

1) Receive data per Data Comms State Machine
2) Start a watchdog timer to prevent possible lockup condition
   a. Disable the watchdog timer once entire data packet is received
   b. If entire data packet is not received within a timeout, set a fault
3) Loop until entire data packet is received
   a. Detect start bit
      i. Start a bit timer watchdog timer to prevent possible lockup condition
      ii. Take multiple data samples near expected middle of bit period and determine if polarity is expected value
      iii. The ratio of received polarity can be used to indicate presence of noise
      iv. If the bit timer watchdog expires, set an alarm
   b. Sample data bit(s)
      i. Take multiple data samples data near expected middle of bit period and determine polarity
      ii. The ratio of received polarity samples can be used to indicate presence of noise
      iii. Continue for expected number of data-bits
   c. Sample parity bit
      i. Take multiple data samples data near expected middle of bit period and determine polarity
      ii. The ratio of received polarity samples can be used to indicate presence of noise
   d. Calculate/compare parity bit
      i. If received parity is not equal to calculated parity, set a fault
   c. Detect stop bit
      i. Take multiple data samples data near expected middle of bit period and determine polarity
      ii. The ratio of received polarity samples can be used to indicate presence of noise Referring now to FIG. 2, an impedance isolation wire-or power supply circuit 20 is shown. The impedance isolation wire-or circuit 12 can be configured to provide synchronization and common-mode noise immunity. Power supply modules can use an open loop timing sweep for pre-charging. There may be no current feedback to limit the output current of individual modules. The power module can have a synchronized start (max one line-cycle variation) to prevent the first module to start having an excessive load. The pre-charge sweep rate switch settings on all parallel modules can match. The pre-charge synchronization and interface system (e.g., the impedance isolation wire or circuit) can be different from the daisy-chain interconnection used for fault handling and configuration.

At power up for the impedance isolated wire-or circuit 20, each parallel power module can assert the wire-or synchronization signal. Generally, as each module completes its initialization, it can de-assert control of the synchronization signal. When the last module releases the synchronization signal, all modules can commence pre-charge at the same time (concurrent precharge process). The synchronization signal can be provided via a pair of wires bridging a resistor divider at each module. Each power module's resistor divider can contribute power to the synchronization pair, and thereby eliminate the need to designate one module as the power source or having a separate power supply. The resistor strings can limit the common-mode current interaction between modules. Each power module can have a first optocoupler to assert the synchronization signal. Each module can also have a second optocoupler circuit including a field effect transistor to read the status of the synchronization signal. Because the synchronization signal can be driven by current signaling (as opposed to voltage), it can offer improved noise immunity in the system cabinet. If there is only one module (non-parallel system), it can start as soon as it de-asserts its own synchronization signal. Once pre-charge has commenced, the synchronization signal can be unused until another pre-charge sweep is required.

Figure 2:
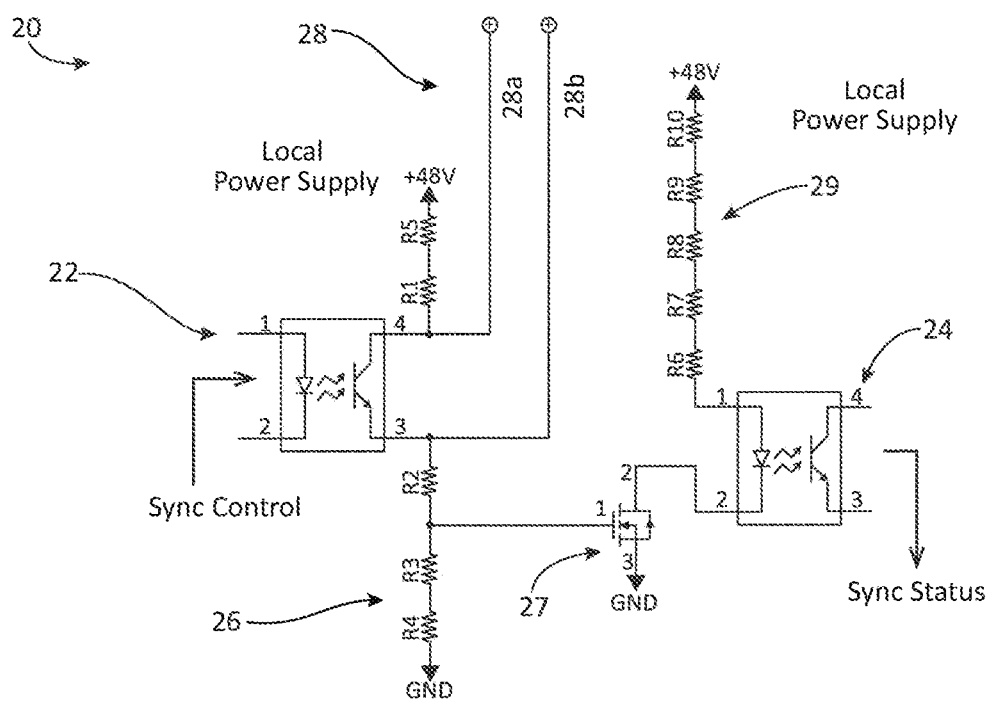
FIG. 2 is an example schematic illustration of an impedance isolated wire-or synchronization power supply circuit, according to some aspects of the disclosure.

As shown in FIG. 2, the power supply circuit 20 includes a first optocoupler 22 for asserting the wire-or (synchronization signal) and a transistor 27 controlling the second optocoupler 24 for reading the status of the wire-or (synchronization signal). When energized, the first optocoupler 22 completes the circuit of a first resistor ladder 26 as shown in FIG. 2. The first resistor ladder 26 includes a first section (R1 and R5) connected to the local power supply voltage and to a first terminal (terminal 4) of the first optocoupler 22. While the local power supply voltage in FIG. 2 is shown to be 48V, it should be noted that different types and magnitudes of local power supplies can be used depending on the intended application. The first resistor ladder 26 also includes a second section (R2, R3, R4) connected to a reference voltage (GND, ground), a second terminal of the first optocoupler (terminal 3), and a transistor 27. The power supply circuit includes a first wire 28a connected to the first optocoupler 22 and a second wire 28b also connected to the first optocoupler 22. The first wire and the second wire are shown to form a wire pair 28. The first wire 28a is connected to the first terminal of the first optocoupler 22 and to the first section of the first resistor ladder 26, and the second wire 28b is connected to the second terminal of the first optocoupler 22 and to the second section of the first resistor ladder 26. The first wire 28a and the second wire 28b can be used to provide the synchronization signal for the power supply module to the synchronization bus of the power supply system on the synchronization terminal of the power supply module as a current signal responsive to the first optocoupler 22 being energized.

As shown in FIG. 2, the power supply circuit 20 also includes a second resistor ladder 29 connected to a first terminal (terminal 1) of the second optocoupler 24. The second resistor ladder 29 is connected to the local power supply voltage and is shown to include five separate resistors. Multiple separate resistors can be used in the resistor ladder 29, as opposed to using a single resistor, to prevent short-circuit failure mode of an individual resistor from causing the safety-limiting values of the second optocoupler 24 from being exceeded (e.g., protecting a 3.3V synchronization status from electrical damage resulting from a 48V supply). The transistor 27 is also shown to be connected to a second terminal of the second optocoupler 24 (terminal 2). The transistor 27 in some implementations is a field effect transistor (FET), where the gate terminal of the FET is connected to the second section of the first resistor ladder 26, the source terminal of the FET is connected to the reference voltage (ground), and the drain terminal of the FET is connected to the second terminal of the second optocoupler 24. It will be appreciated that the magnitudes of the impedance provided by each of the resistors shown in the first resistor ladder 26 and the second resistor ladder 29 can be varied and/or different quantities of resistors can be used, depending on the intended application.

In general, the resistors in the first resistor ladder 26 can provide energy to the wire pair 28, while providing impedance to block common-mode noise between power supply modules interconnected in a power supply system configuration. The power supply circuit 20 can optionally be connected in parallel to additional modules through the cabinet harness, in which case all modules are providing energy. The optocoupler from one power module can be sufficient to complete the resistor ladder circuits of multiple modules. In some examples, up to six power supply modules can be used in a power supply system. Synchronization signal wire pairs can use current signaling (as opposed to voltage signaling) for immunity to noise in the system cabinet. The transistor 27 can be used to detect voltage drops across the resistor ladders so that the synchronization status optocoupler 24 does not impact the load current through the resistor ladders. Given the sensitive nature of the logic circuits used to control the sync control and sync status signals, it is important to protect these circuits from outside noise interference. In some implementations, use of a 48V power supply can allow higher resistance values to be used for the resistors (in the first resistor ladder 26 and the second resistor ladder 29) while still maintaining adequate current for the first optocoupler 22 and the second optocoupler 24.

Figure 3:
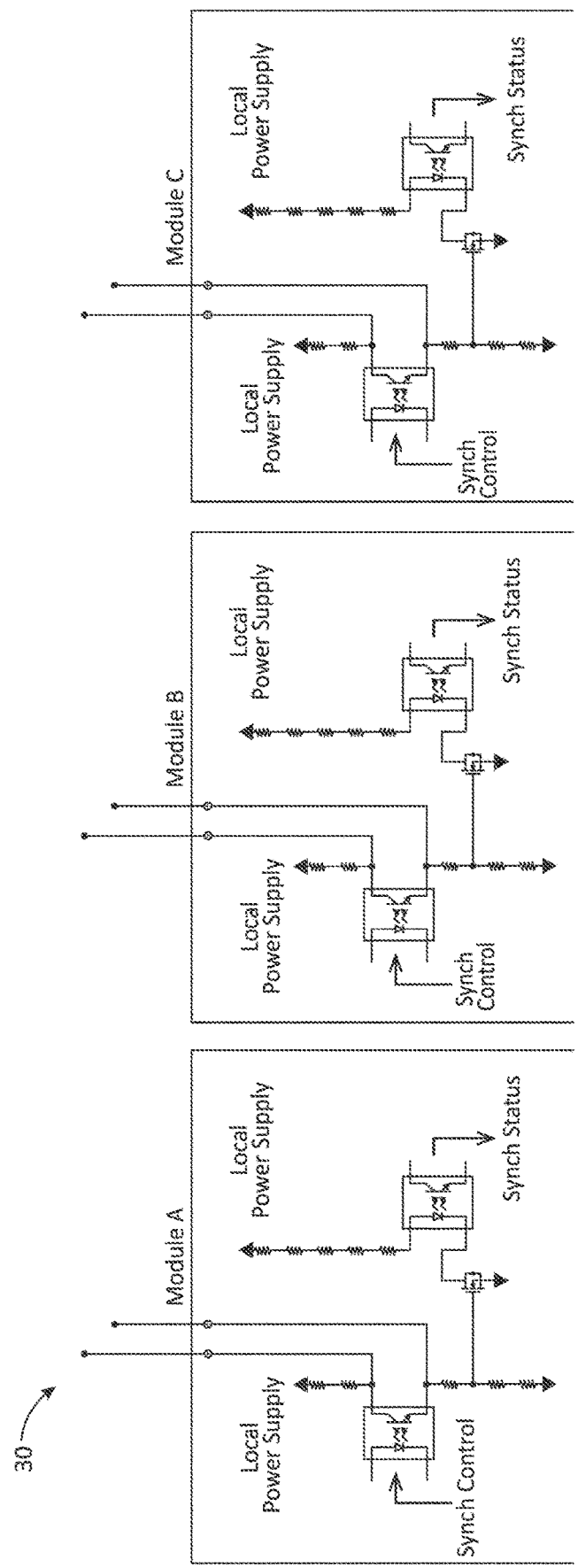
FIG. 3 is an example schematic illustration of a power supply system connecting three separate power supply modules via a synchronization bus, according to some aspects of the disclosure.

FIG. 3 shows another example power module system 30. Power module system 30 includes three separate modules connected to a synchronization bus as part of a power supply system. Each of Module A, Module B, and Module C as shown in FIG. 3 include the impedance isolated wire-or circuit 20 described above for asserting and de-asserting respective synchronization signals on the synchronization bus, and reading the status of the respective synchronization signals. FIG. 3 illustrates an example of how the synchronization terminals of each power supply module including the synchronization wire pairs are interconnected via the synchronization bus in the system cabinet wire harnessing.

If an open interconnection in the wire harness exists, one or more modules can operate independently without waiting for all modules to be ready before commencing a concurrent precharge process. A synchronization system integrity verification test can be implemented at power-up to protect against these types of situations. In the event of open interconnections in the wire-or implantation, this condition can allow non-synchronized pre-charge, with imbalance current between modules. To prevent this situation, the integrity of the synchronization harness system can be tested at power up. The unique manufacturing serial number of each module can be transmitted through the daisy chain wire harness system like described above in the data communications state machine example implementation. This functionality can allow each power supply module to learn about which other modules are present in the system. Each module can take turns asserting the synchronization signal, in order of the manufacturing serial number. Each module can verify that it can detect the synchronization test pulses for the expected number of modules, otherwise the system can be faulted. An example wire-or synchronization system verification operation is provided below.

SYNC Testing State Machine

1) Wait for data comms complete
2) loop for 1 to module count
   a. If SN order=loop count then assert sync, else detect sync
   b. Assert sync for assert-test time
   c. De-assert sync for de-assert-test time
   d. Detect sync
      i. If sync not detected within detect-test time, then
         1. Set sync testing fault
         2. Sync testing done
      ii. If sync detected, then
         1. If loop count=roll-in count, then
            a. sync testing done
         2. If loop count 1=roll-in count, then
            a. increment loop count
3) Sync testing done FIGS. 4-9 show various example components of a wire harness, such as the wire harness 12, that can be used to connect individual power supply modules of a power supply system. The components shown in FIGS. 4-9 can be used in combination and/or separately, depending on the intended configuration of the specific implementation of the power supply system. For simplification, FIGS. 4-9 show single lines in place of wire pairs. The components shown in FIGS. 4-9 are provided as examples, and it will be appreciated that many different configurations and combinations of these components are possible, in addition to other possible types of components that can be used with a wire harness to connect power supply modules in accordance with various aspects of the disclosure.

Figure 4:
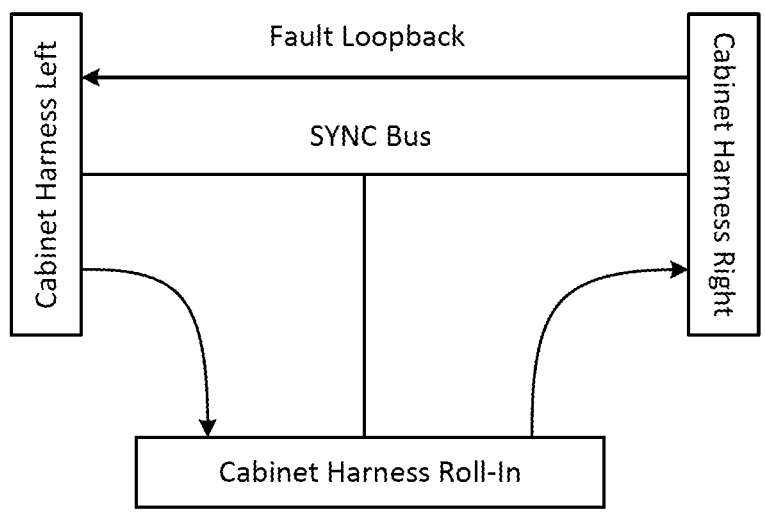
FIG. 4 is an example illustration of different components of a wire harness for a power supply system, according to some aspects of the disclosure.

Referring specifically to FIG. 4, an example wire harness assembly 32 is shown. The wire harness assembly 32 can generally be a T-shaped cabinet harness that supports multiple system configurations with a common harness configuration. The wire harness assembly 32 can be pre-installed in an electrical cabinet during manufacturing of the power supply system. The power supply system including one or more power supply modules can be implemented within one electrical cabinet, or within multiple electrical cabinets. Each system cabinet can have a harness to support the cabinet fault daisy chain and pre-charge synchronization interconnections between parallel modules. The cabinet harnesses can provide 240 Volts of AC power to the individual modules, in some implementations. The wire harness assembly 32 is shown to include both a synchronization bus (SYNC bus) and a fault bus (Fault Loopback). The fault bus and the synchronization bus can be connected to individual modules via wire pairs. The synchronization bus signals going to the left and to the right in each cabinet harness (sections of an interconnected wire harness) can be separate wire pairs that are electrically tied together by the main control board, rather than having a "T" splice in the harness itself. This configuration can simplify harness construction.

Figure 5:
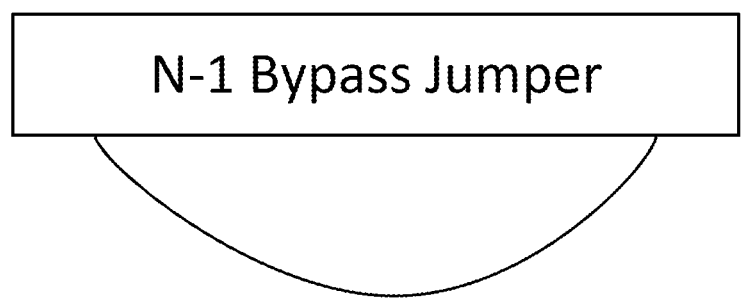
FIG. 5 is an example illustration of a bypass jumper that can be used with a wire harness for a power supply system, according to some aspects of the disclosure.

Referring specifically to FIG. 5, an example bypass jumper 33 is shown. The bypass jumper 22 can be attached to the system cabinet and can tie the synchronization bus wires together for N-1 operation. The bypass jumper 33 can be pre-installed during manufacturing, and located in a position such that it may not be accessible when the power supply module is in the cabinet. In this sense, if an individual power supply module is removed from the power supply system, the bypass jumper 33 can be used to continue normal system operation with the remaining power supply modules, such that the entire power supply system is not disabled and does not need to be entirely reconfigured and synchronized. Accordingly, using one or more bypass jumpers within the wire harness can provide improved modularity and flexibility of the power supply system.

Figure 6:
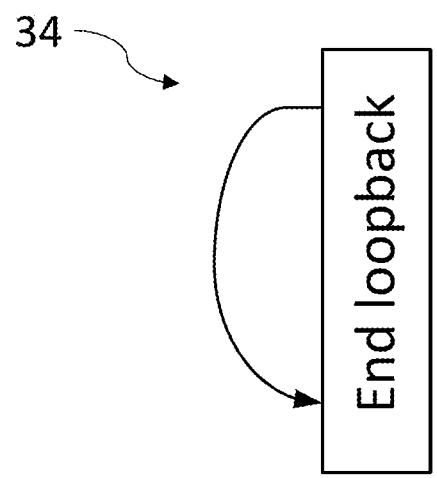
FIG. 6 is an example illustration of a loopback jumper that can be used with a wire harness for a power supply system, according to some aspects of the disclosure.
Figure 7:
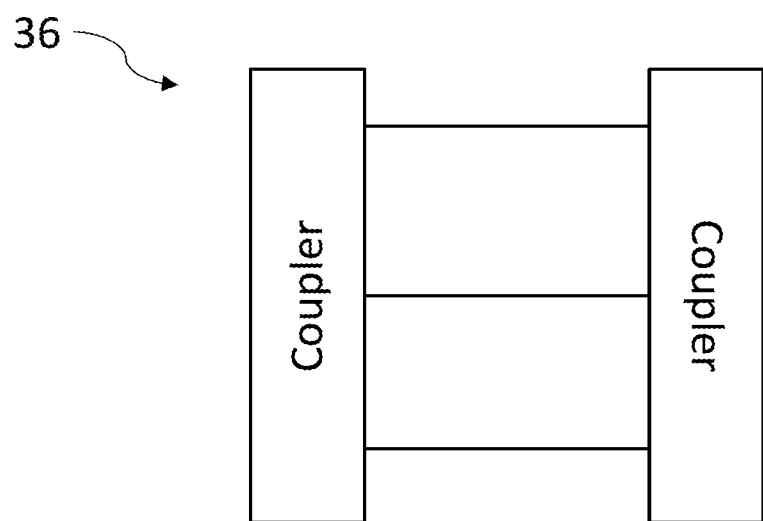
FIG. 7 is an example illustration of a coupler that can be used with a wire harness for a power supply system, according to some aspects of the disclosure.

Referring specifically to FIG. 6, an example loopback jumper 34 is shown. Loopback jumper 34 can be provided on either side of the "T" harness (shown in FIG. 4) when there is no adjacent system cabinet, such that fault signals provided on the fault bus can be looped back to the power supply module at the opposite end of the daisy chain. Referring specifically to FIG. 7, an example harness coupler 36 is shown. The harness coupler 36 can be used between adjacent system cabinets, such that the coupler 36 connects the synchronization bus and the fault bus of the system wire harness between cabinets (e.g., between a first cabinet and a second cabinet).

Figure 8:
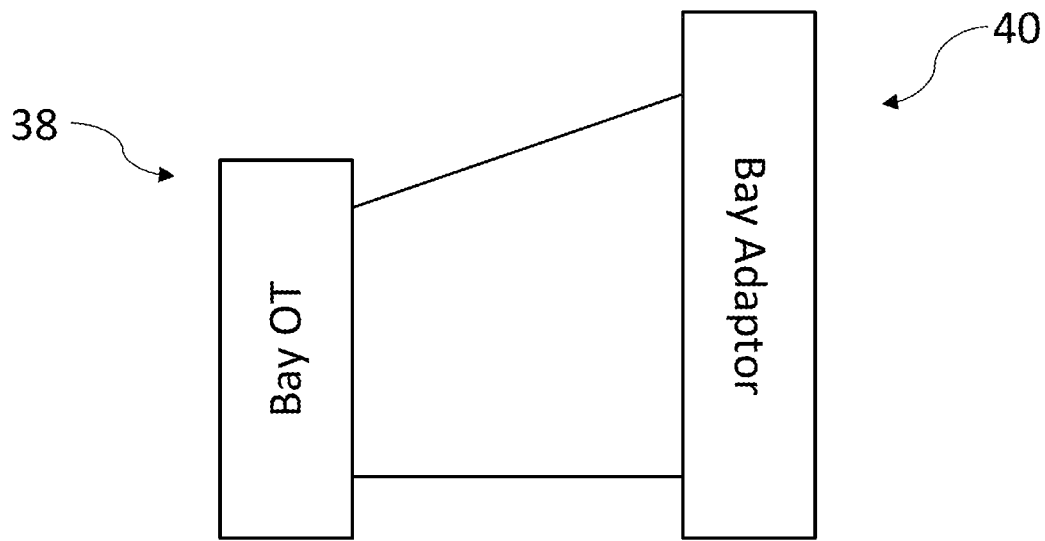
FIG. 8 is an example illustration of an adapter that can be used with a wire harness for a power supply system, according to some aspects of the disclosure.
Figure 9:
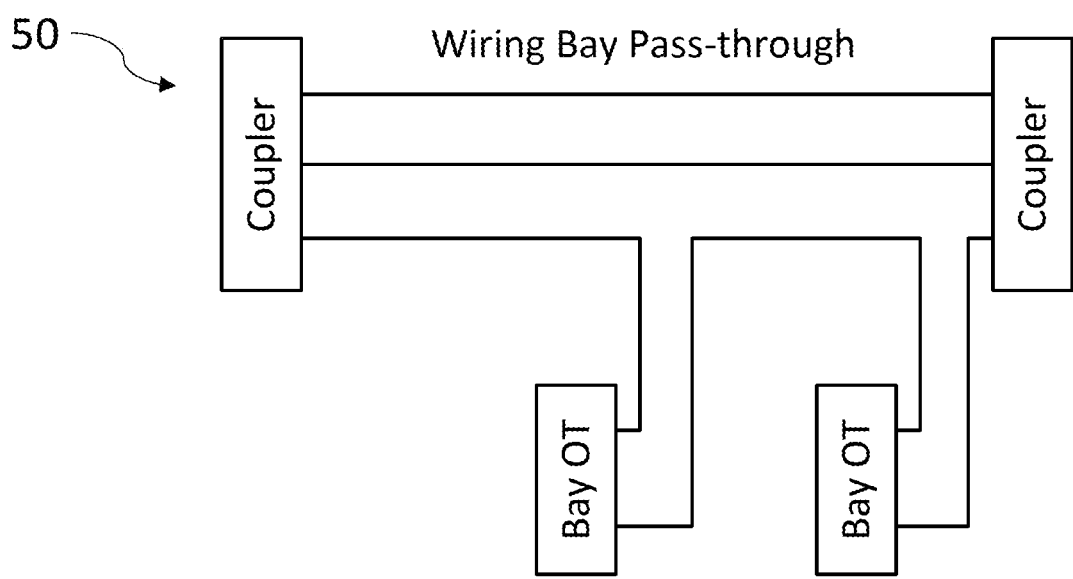
FIG. 9 is an example illustration of a wiring bay pass-through device that can be used with a wire harness for a power supply system, according to some aspects of the disclosure.

Referring specifically to FIG. 8, an example wiring bay adapter 40 and an example adapter 38 used to connect a thermal switch are shown. Wiring bay adapter 40 can be used to connect the system wire harness to a wiring bay provided in an electrical cabinet, and adapter 38 can be used to connect the system wire harness to a thermal switch. The connections to the wiring bay and the thermal switch can be used for fault detection because of overtemperature, and for connecting various components of the power supply system between one or more electrical cabinets in a facility. Referring specifically to FIG. 9, an example wiring bay pass-through device 50 is shown. The wiring bay pass-through device 50 can be used to connect the power supply system synchronization and cabinet fault signals, for example. The wiring bay pass-through device 50 can also be used to provide a common connection for busbar thermal switches.

FIGS. 10-14D provide examples of different power supply system configurations that can be implemented in accordance with aspects of the disclosure. Each of the modules shown in FIGS. 10-14D can include aspects of the modules and circuits shown and described above with respect to FIGS. 1-3, and each of the wire harnesses shown can include one or more of the components shown and described above with respect to FIGS. 4-9. For example, each of the power supply modules shown can include the power supply circuit 20 discussed above, and can be interconnected via fault input and output terminals as discussed with respect to system 10 above. The configurations shown and described with respect to FIGS. 10-14D are provided as examples, and it will be appreciated that various power supply system configurations and associated circuits can be implemented in accordance with aspects of the present disclosure.

Figure 10:
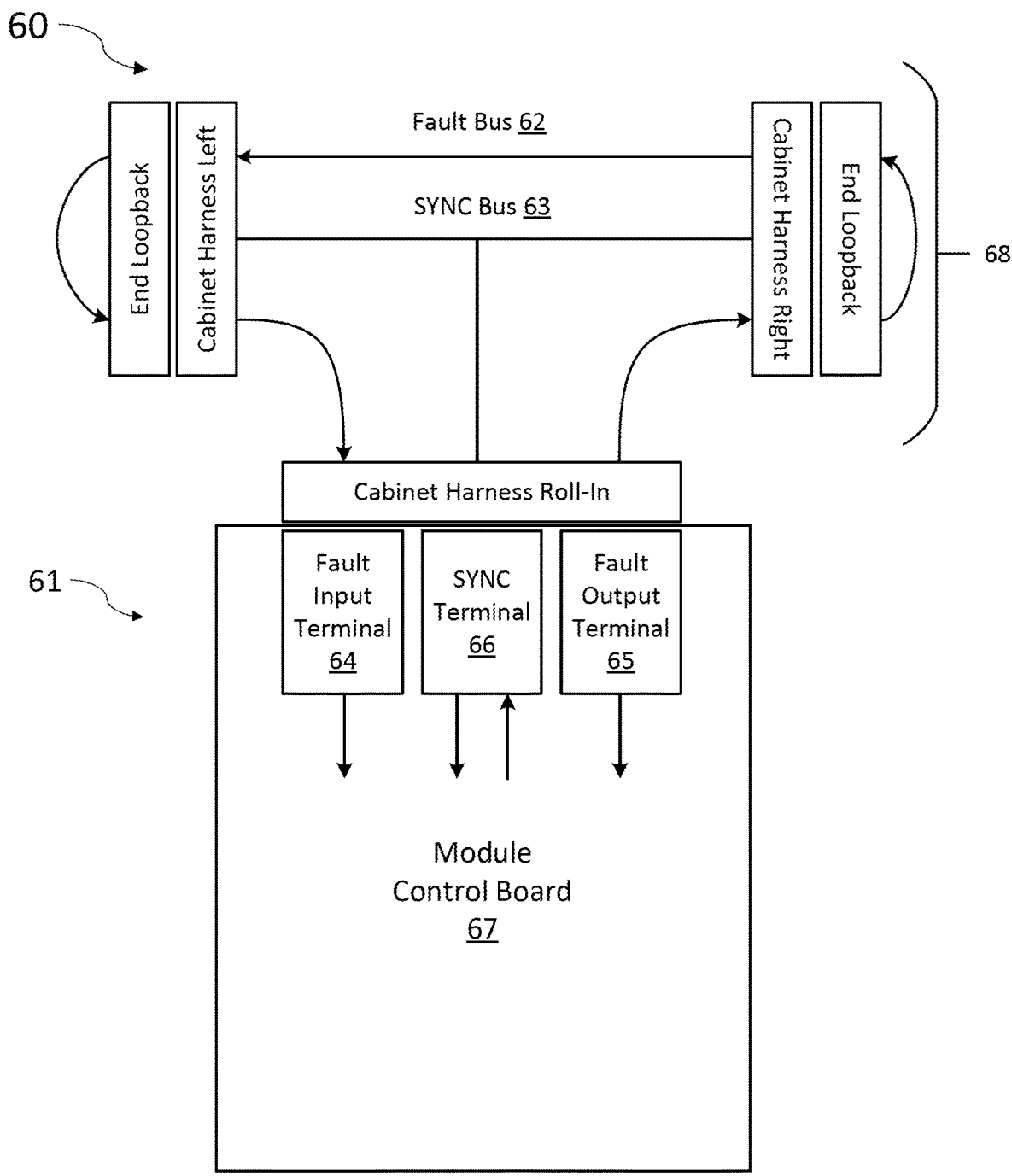
FIG. 10 is an example illustration of a power supply system including a single power supply module and a wire harness, according to some aspects of the disclosure.

Referring specifically to FIG. 10, an example power supply system 60 including a single power supply module 61, where power supply system 60 does not have a wiring bay, is shown. As shown, power supply module 61 includes a fault input terminal 64, a fault output terminal 65, a synchronization terminal 66, and a module control board 67. The module control board 67 can include one or more processors and memory, for example, for implementing functionality discussed herein as well as additional functionality. Also shown, the power supply module 61 is connected to a wire harness 68 that includes both a fault bus 62 and a synchronization bus 63. The fault bus 62 can be connected to both the fault input terminal 64 and the fault output terminal 65 in this configuration, where the fault bus 62 uses loopback jumpers like loopback jumper 34. Power supply module 61 can be connected to additional power supply modules via harness 68, such as discussed in the example system configurations below.

Figure 11:
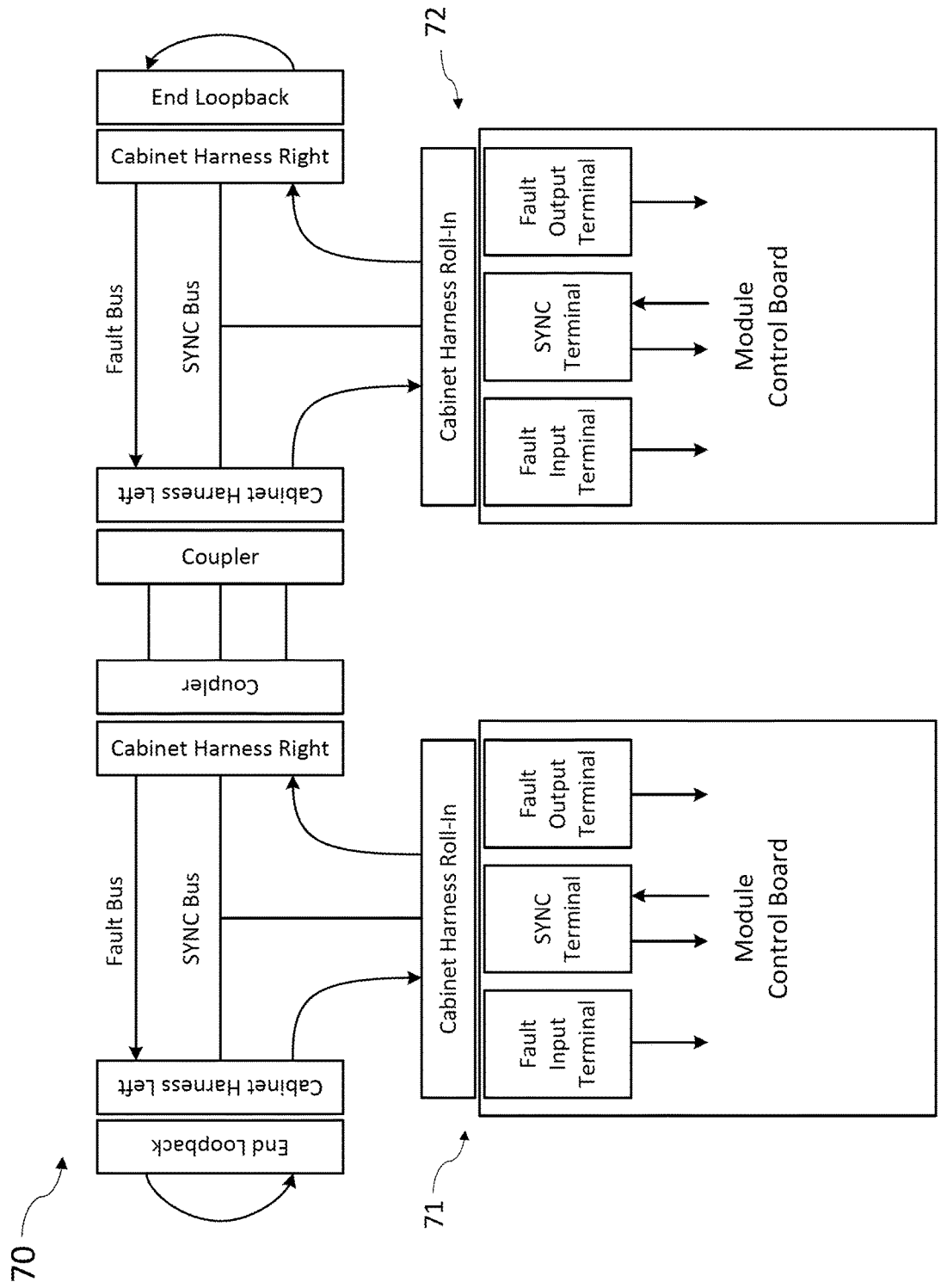
FIG. 11 is an example illustration of a power supply system including two power supply modules and a wire harness, according to some aspects of the disclosure.

Referring specifically to FIG. 11, an example power supply system 70 including two power supply modules is shown. As shown, a power module 71 and a power module 72 are connected via a wire harness including a fault bus and a synchronization bus. Power supply system 70 can require a wiring bay with a busbar overtemperature switch (not shown), in some implementations. The hard fault output of the power supply module 71 is routed through the wire via the fault bus harness to the cabinet fault input of the power supply module 72. The hard fault output of the power supply module 72 is looped back into the cabinet fault input of the power supply module 71. The synchronization terminals of each of the two power supply modules 71, 72 are wire-or'd together, so that pre-charge will commence when both modules are ready.

Figure 12:
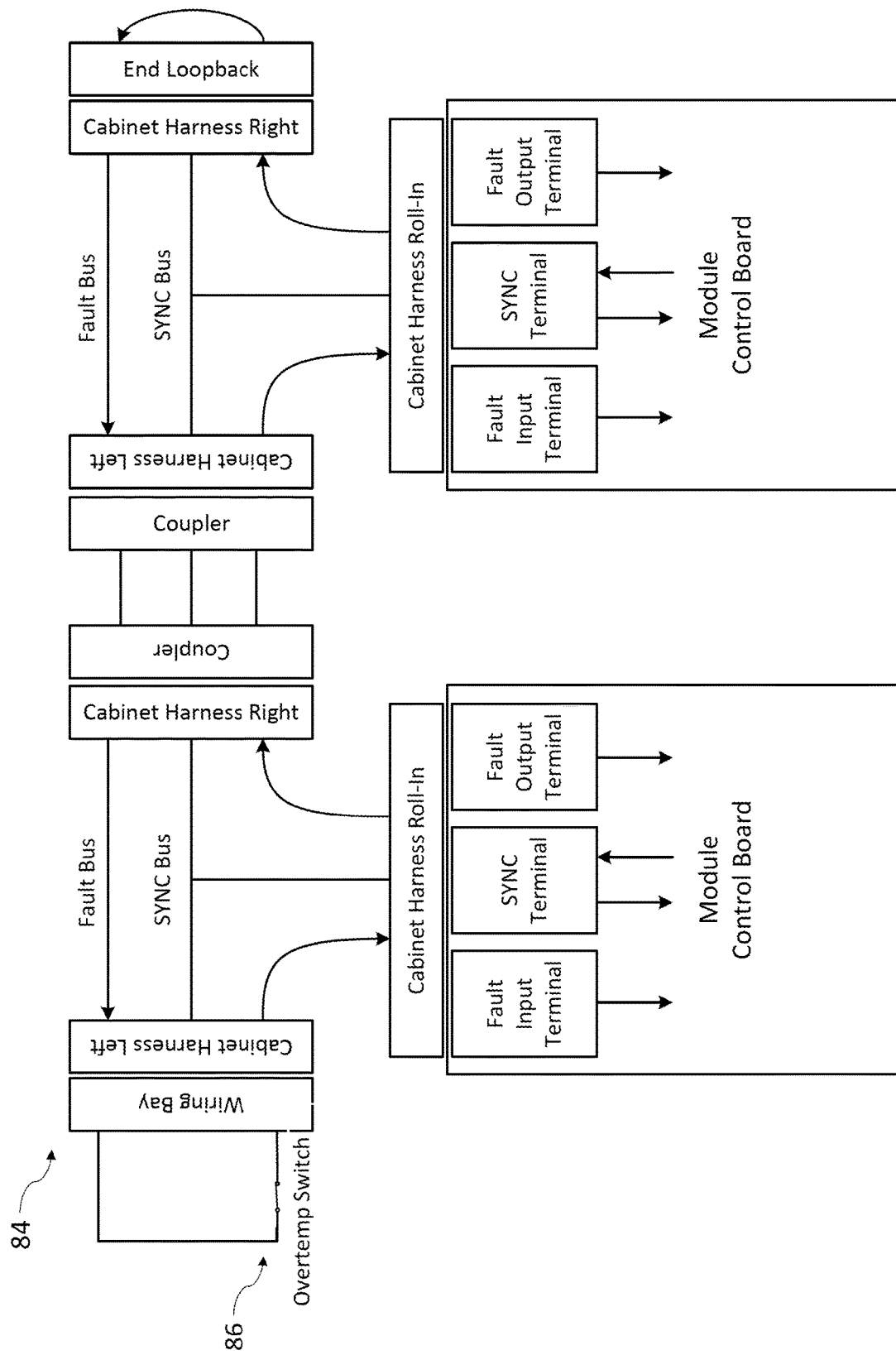
FIG. 12 is an example illustration of a power supply system including two power supply modules, a wiring bay, a thermal switch, and a wire harness, according to some aspects of the disclosure.

Referring specifically to FIG. 12, another example implementation of the power supply system 70 including a wiring bay 84 and thermal switch 86 is shown. The hard fault output of the power supply module 71 is routed through the wire harness into the cabinet fault input of the power supply module 72. The hard fault output of the power supply module 72 loops back to the left side, and then passes through a normally closed busbar overtemperature switch 86 before connecting into the cabinet fault input of the power supply module 71. If the overtemperature switch 86 opens due to high temperature (e.g., sensing a temperature above a threshold level), it will interrupt the cabinet fault signal. The cabinet fault input of the power supply module 80 can be triggered either by the hard fault output of the power supply module 72, or by the overtemperature switch 86 in the wiring bay 84. Wiring bay 84 can be implemented using wiring bay adapter 40 and adapter 38 as discussed above with respect to FIG. 8, for example. The synchronization terminals of each of the two power supply modules 71, 72 are wire-or'd together, so that pre-charge will commence when both modules are ready.

Figure 13A:
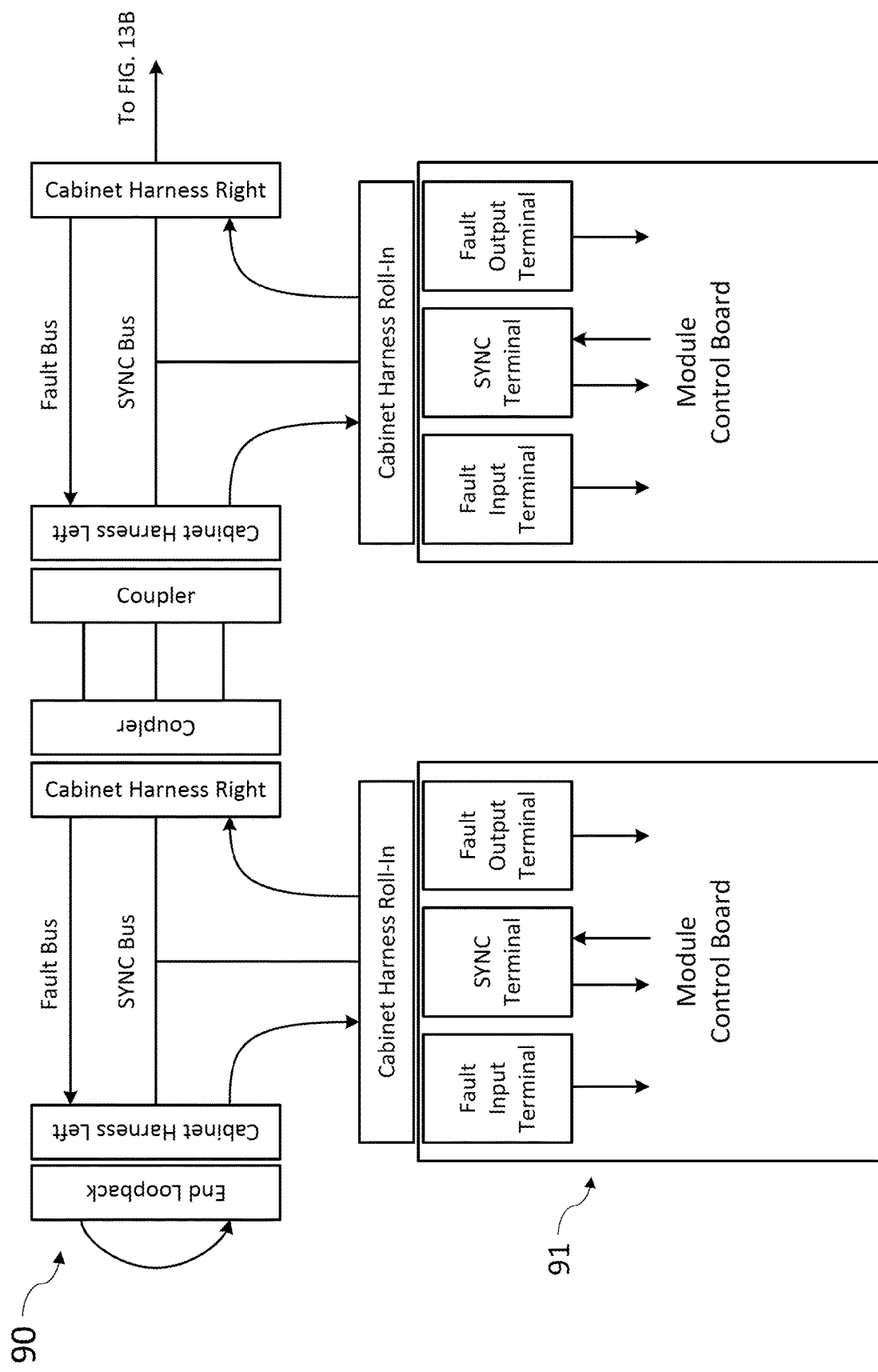
FIGS. 13A-13D provide an example illustration of a power supply system including six power supply modules and a wire harness, according to some aspects of the disclosure.
Figure 13B:
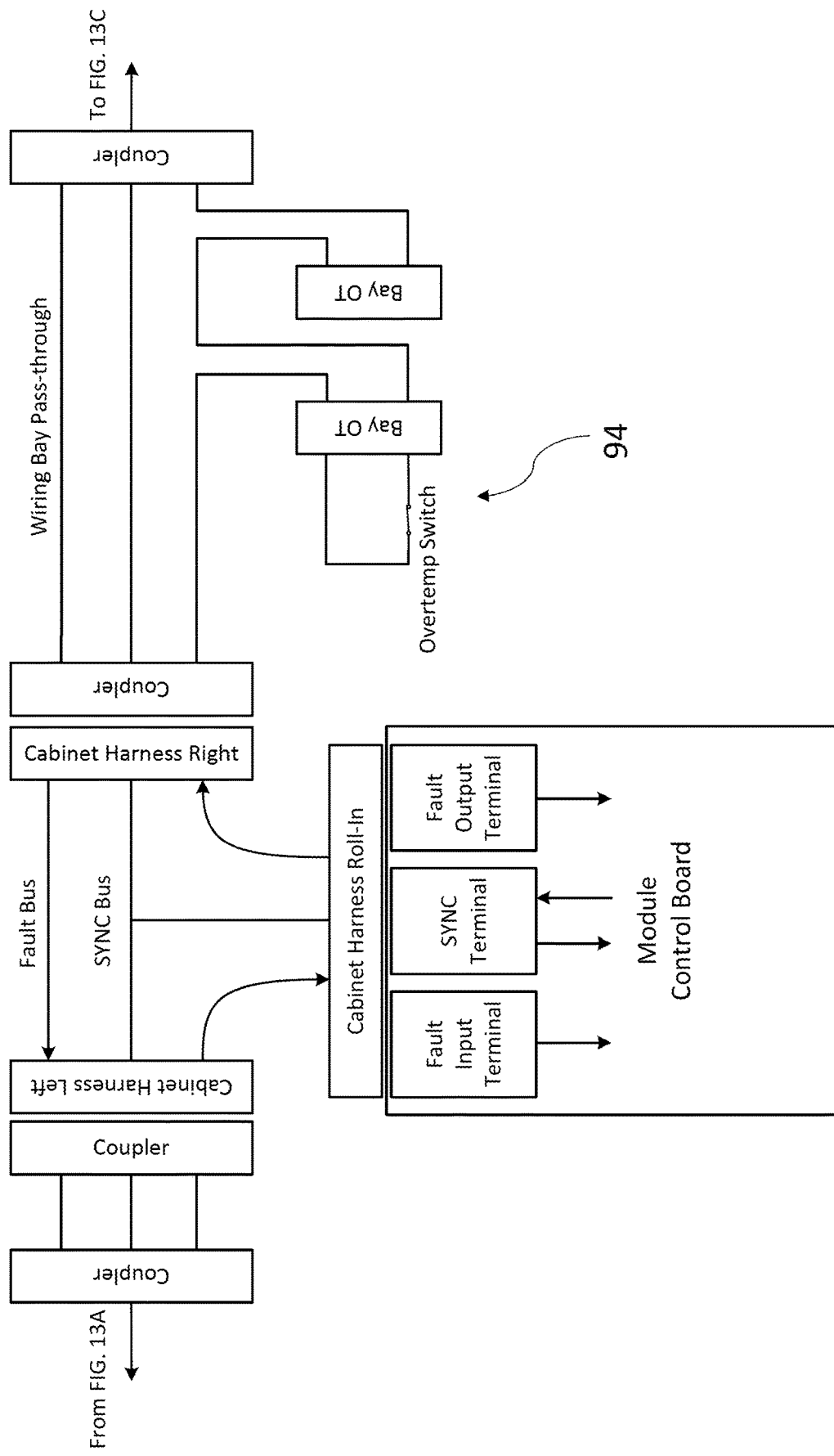
Figure 13C:
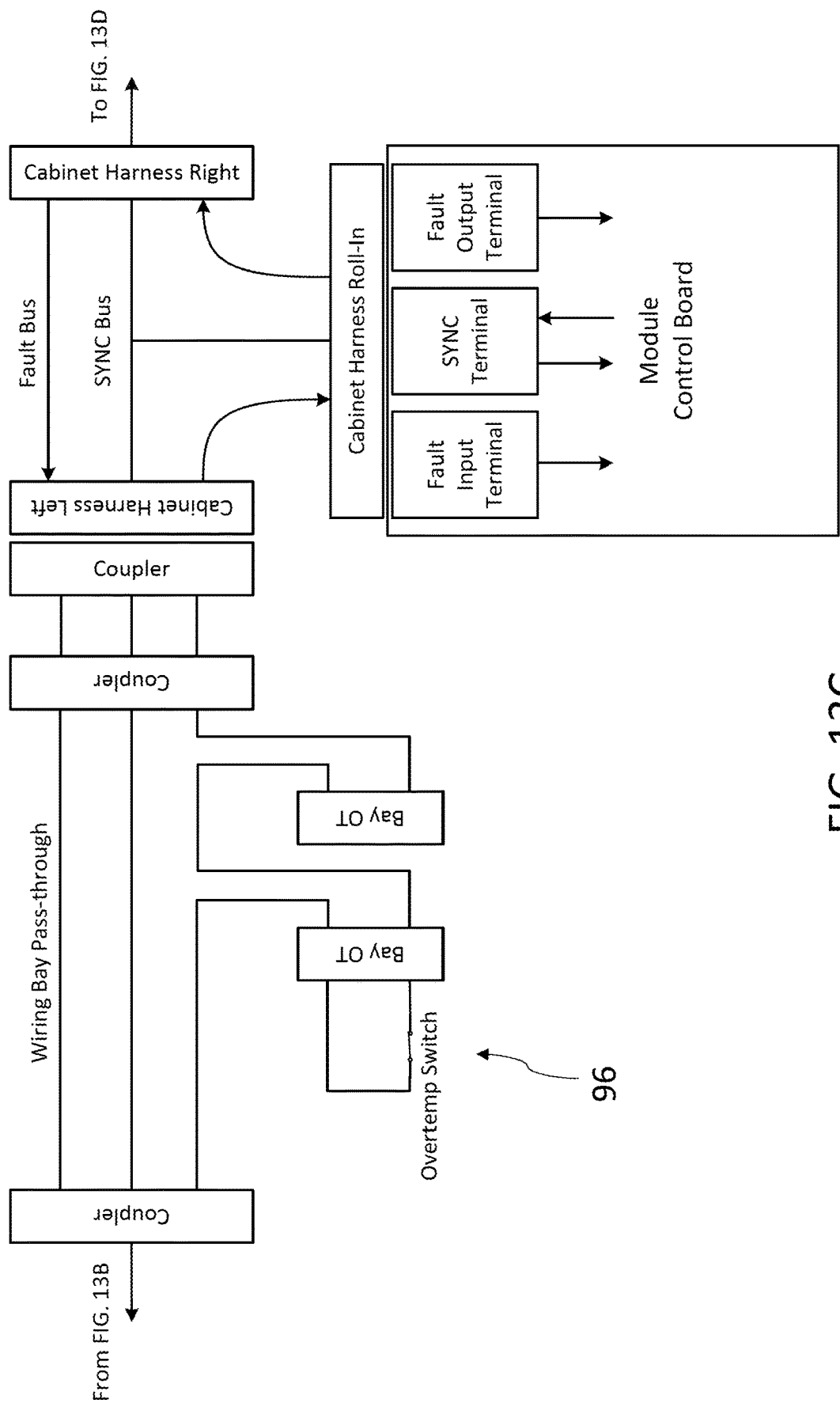
Figure 13D:
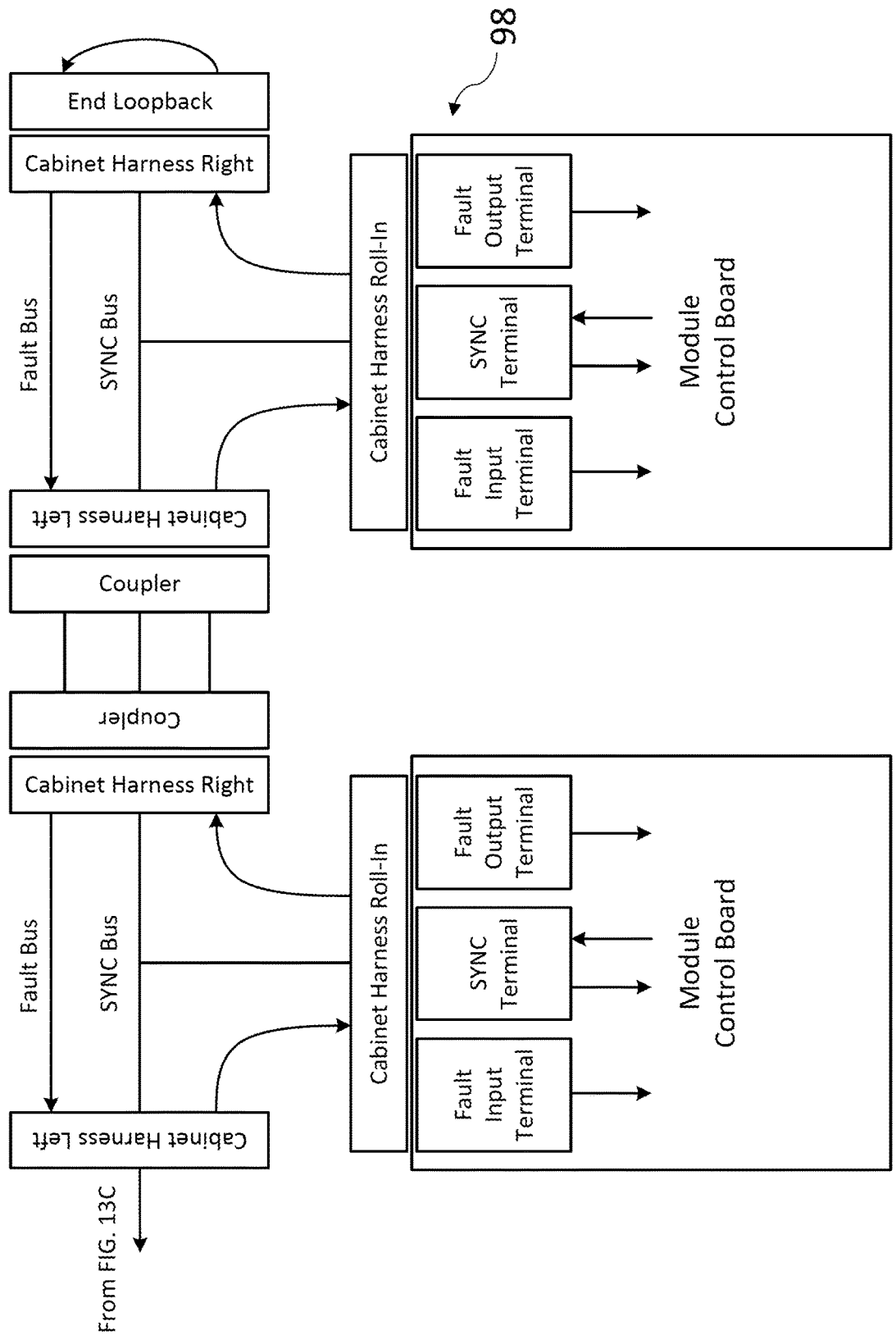
Figure 14A:
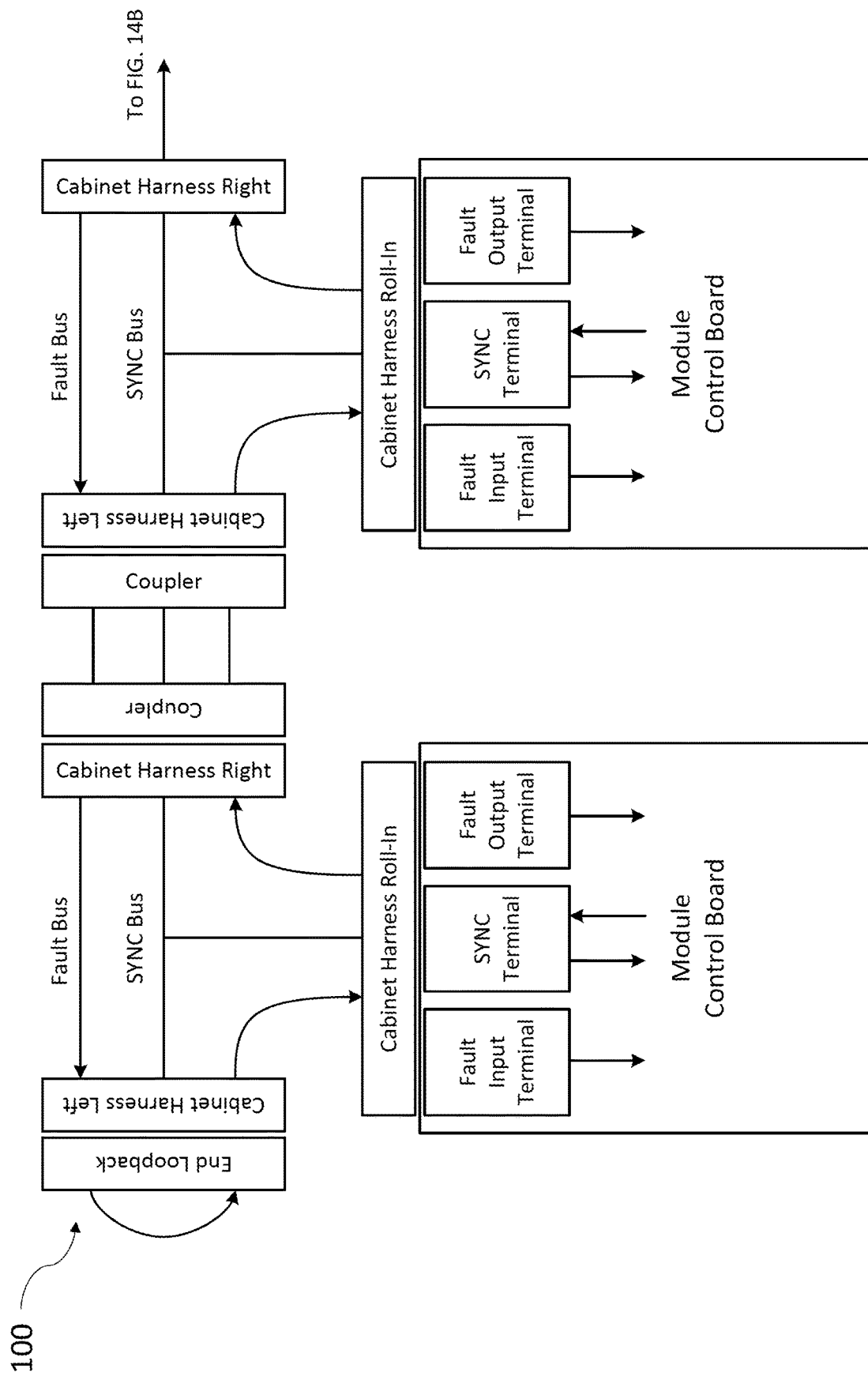
FIGS. 14A-14D provide an example illustration of a power supply system including five power supply modules, a bypass jumper, and a wire harness, according to some aspects of the disclosure.
Figure 14B:
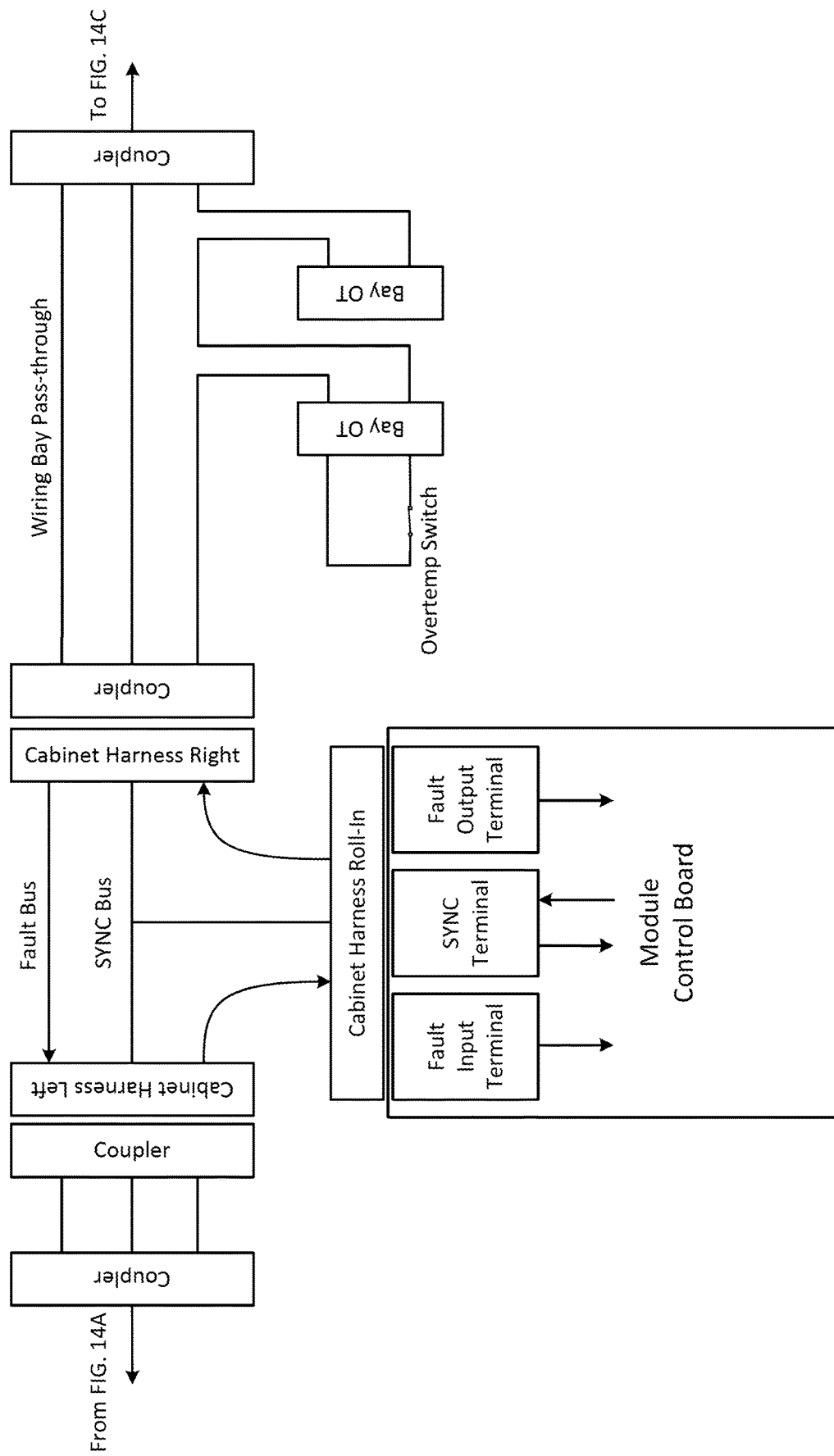
Figure 14C:
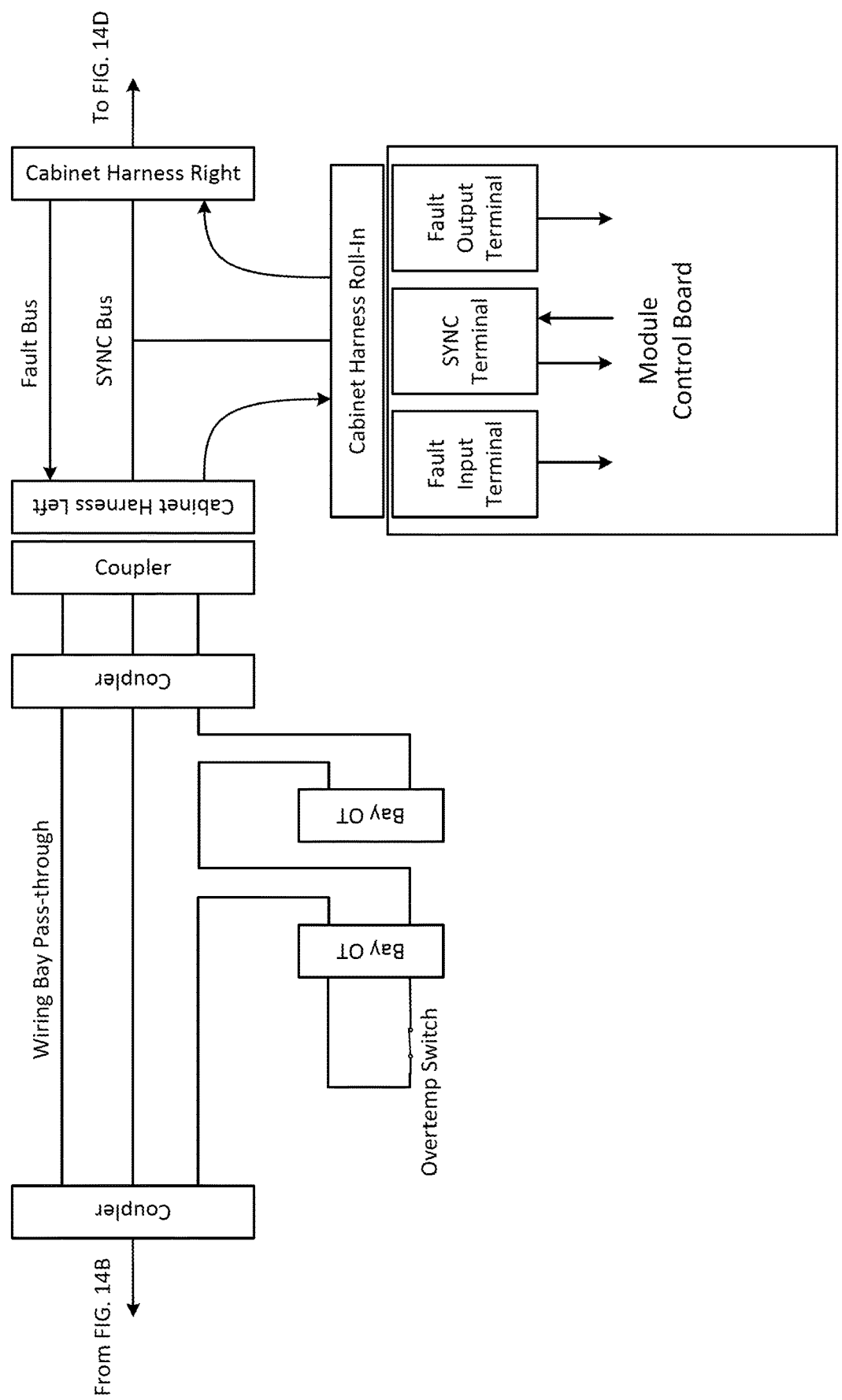
Figure 14D:
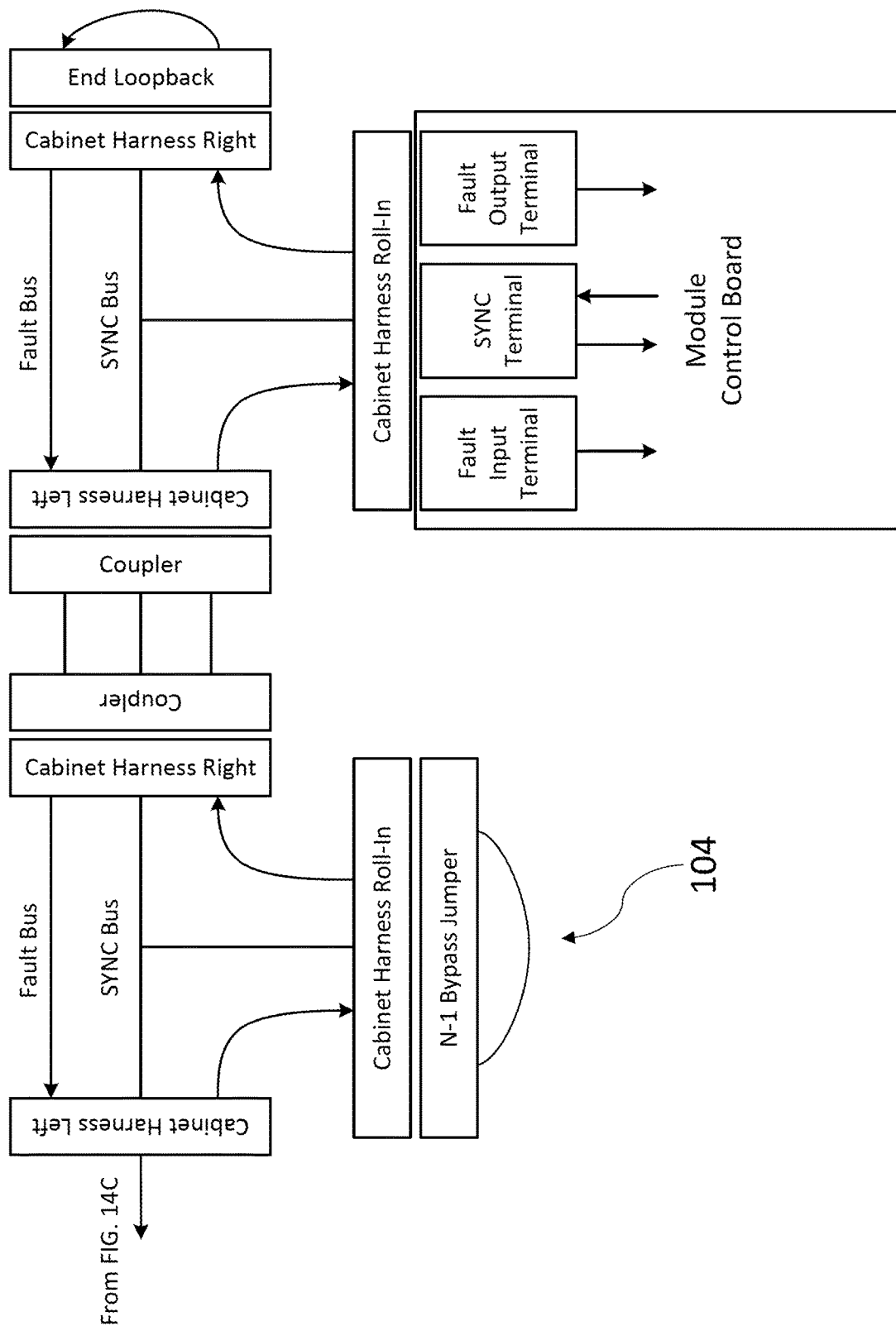

Referring specifically to FIGS. 13A-13D, another example power supply system 90 is shown. Power supply system 90 includes six power supply modules with two wiring bays. From the leftmost module 91, each hard fault output terminal is routed through the harness into the cabinet fault input of the next right module. The cabinet fault signal passes through the overtemperature switches of the two wiring bays 94, 96 near the center of the system. Depending on the application, two wiring bay overtemperature connectors (e.g., like adapter 38) can be used on a single harness as shown in FIG. 13B and FIG. 13C. A second thermal switch can also be connected to the second wiring bay overtemperature connectors shown. A single overtemperature connector can also be used depending on the application. If an overtemperature switch opens, it will interrupt the cabinet fault signal on the fault bus. The hard fault output of the rightmost module 98 is looped back into the cabinet fault input of the leftmost module 91. A cabinet input to a module is one possible source of a module hard fault output. This causes any hard fault source to automatically cascade through the daisy-chain of all power supply modules of the system. All power modules can display a cabinet fault (system level fault), but the power module with the original hard fault source (device level fault) will also display the corresponding fault code. If none of the power modules display anything but a cabinet fault, then the source of the fault is either an open wiring bay overtemperature switch, unplugged connection, or faulty connection contact. The synchronization terminals of all six power supply modules in power supply system 90 are wire-or'd together, so that pre-charge will commence when all of the modules are ready.

Referring specifically to FIGS. 14A-14D, another example power supply system 100 is shown. In contrast to the power supply system 90 shown in FIGS. 13A-13D, in the power supply system 100, one of the six power supply modules has been removed from the system, and its connections replaced by a bypass jumper 104. As such, the power module system 100 is configured to operate in an N-1 operation of the system at a reduced capacity. The bypass jumper 104 can be connected in place of the removed power supply module to complete the cabinet fault signal chain. The system can include a bypass jumper mounted in each cabinet that the module normally blocks access to. This design enables bypass jumpers to be readily available when modules are removed. This design can also prevent having the bypass inadvertently connected when the removed module is in place. Multiple power supply modules can be removed and bypassed (e.g., N-2, N-3, etc. down to the case where only a single power supply module remains).

While the present disclosure can be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims. The techniques presented and claimed herein are referenced and applied to material objects and concrete examples of a practical nature that demonstrably improve the present technical field and, as such, are not abstract, intangible or purely theoretical.

The invention claimed is:

1. A power supply circuit comprising:
 a first optocoupler for asserting a synchronization signal;
 a second optocoupler for reading a status of the synchronization signal;
 a resistor ladder connected to the first optocoupler and to a power supply voltage;
 a field effect transistor, wherein a gate of the field effect transistor is connected to the resistor ladder, a source of the field effect transistor is connected to a reference voltage, and a drain of the field effect transistor is connected to the second optocoupler;
 a first wire connected to the first optocoupler; and
 a second wire connected to the first optocoupler;
 wherein the power supply circuit is configured to assert the synchronization signal as a current signal via the first wire and the second wire responsive to the first optocoupler being energized.

2. The power supply circuit of claim 1, wherein the resistor ladder comprises a first resistor ladder, and wherein the power supply circuit further comprises a second resistor ladder connected to the second optocoupler and to the power supply voltage.

3. The power supply circuit of claim 2, wherein a first terminal of the second optocoupler is connected to the second resistor ladder and a second terminal of the second optocoupler is connected to the field effect transistor.

4. The power supply circuit of claim 1, wherein the resistor ladder comprises a first section and a second section, the first section connected to a first terminal of the first optocoupler and the second section connected to a second terminal of the first optocoupler.

5. The power supply circuit of claim 4, wherein the first section of the resistor ladder is connected to the power supply voltage and the second section of the resistor ladder is connected to a reference voltage and to the field effect transistor.

6. A power supply system comprising:
 a first power supply module comprising a first optocoupler, a first resistor ladder connected to the first optocoupler and to a first power supply voltage, and a first pair of wires connected to the first optocoupler;
 a second power supply module comprising a second optocoupler, a second resistor ladder connected to the second optocoupler and to a second power supply voltage, and a second pair of wires connected to the second optocoupler; and
 a synchronization bus connected to the first power supply module and the second power supply module, wherein:
  the first power supply module asserts a first synchronization signal on the synchronization bus responsive to the first optocoupler being energized, and the first power supply module asserts the first synchronization signal on the synchronization bus as a current signal provided to the synchronization bus via the first pair of wires;
  the second power supply module asserts a second synchronization signal on the synchronization bus responsive to the second optocoupler being energized, and the second power supply module asserts the second synchronization signal on the synchronization bus as a current signal provided to the synchronization bus via the second pair of wires; and
  the power supply system establishes a synchronization between the first power supply module and the second power supply module responsive to the first synchronization signal and the second synchronization signal being asserted and de-asserted on the synchronization bus.

7. The power supply system of claim 6, wherein the first power supply module further comprises a third optocoupler for reading a status of the first synchronization signal.

8. The power supply system of claim 7, wherein the first power supply module further comprises a third resistor ladder connected to the third optocoupler and to the first power supply voltage.

9. The power supply system of claim 6, wherein the first power supply module further comprises a transistor connected to the first resistor ladder and to the second optocoupler.

10. The power supply system of claim 6, wherein the power supply system establishes the synchronization between the first power supply module and the second power supply module by initiating a concurrent precharge process for the first power supply module and the second power supply module.

11. The power supply system of claim 6, wherein the first resistor ladder comprises a first section and a second section, the first section connected to a first terminal of the first optocoupler and the second section connected to a second terminal of the first optocoupler.

12. The power supply system of claim 11, wherein the first section of the first resistor ladder is connected to the first power supply voltage and the second section of the first resistor ladder is connected to a reference voltage.

13. A power supply circuit comprising:
a first optocoupler;
a second optocoupler for reading a status of a synchronization signal;
a resistor ladder connected to the first optocoupler and to a power supply voltage, wherein the resistor ladder comprises a first section and a second section, the first section connected to a first terminal of the first optocoupler and the second section connected to a second terminal of the first optocoupler;
a field effect transistor, wherein a gate of the field effect transistor is connected to the resistor ladder, a source of the field effect transistor is connected to a reference voltage, and a drain of the field effect transistor is connected to the second optocoupler;
a first wire connected to a first terminal of the first optocoupler; and
a second wire connected to a second terminal of the first optocoupler;
wherein the power supply circuit is configured to assert the synchronization signal as a current signal via the first wire and the second wire responsive to the first optocoupler being energized.

14. The power supply circuit of claim 13, wherein the resistor ladder comprises a first resistor ladder, and wherein the power supply circuit further comprises a second resistor ladder connected to the second optocoupler and to the power supply voltage.

15. The power supply circuit of claim 14, wherein a first terminal of the second optocoupler is connected to the second resistor ladder and a second terminal of the second optocoupler is connected to the field effect transistor.

* * * * *